(12) United States Patent
Lee et al.

(10) Patent No.: US 8,163,606 B2
(45) Date of Patent: Apr. 24, 2012

(54) METHOD OF MANUFACTURING LIQUID CRYSTAL DISPLAY DEVICE

(75) Inventors: Seok Woo Lee, Bucheon-si (KR); Seung Chan Choi, Goyang-si (KR)

(73) Assignee: LG Display, Co., Ltd., Seoul (KR)

( * ) Notice: Subject to any disclaimer, the term of this patent is extended or adjusted under 35 U.S.C. 154(b) by 299 days.

(21) Appl. No.: 12/654,586

(22) Filed: Dec. 23, 2009

(65) Prior Publication Data

US 2010/0330718 A1 Dec. 30, 2010

(30) Foreign Application Priority Data

Jun. 29, 2009 (KR) .................. 10-2009-0058445

(51) Int. Cl.
*H01L 21/00* (2006.01)
(52) U.S. Cl. ................ 438/161; 257/E21.411
(58) Field of Classification Search .......... 438/30, 438/149, 153, 157, 161, 283; 257/E21.094, 257/E21.104, E21.121, E21.372, E21.411
See application file for complete search history.

(56) References Cited

U.S. PATENT DOCUMENTS 7,800,177 B2 * 9/2010 You et al. .......... 257/347

* cited by examiner

*Primary Examiner* — Quoc Hoang
(74) *Attorney, Agent, or Firm* — McKenna Long & Aldridge LLP

(57) ABSTRACT

A method of manufacturing an LCD device is disclosed. The LCD device manufacturing method includes: forming first and second active patterns on P-channel and N-channel thin film transistor formation regions of a substrate using a first masking process, respectively; forming a first gate electrode on the P-channel thin film transistor formation region of the substrate using a second masking process; forming a second gate electrode on the N-channel thin film transistor formation region of the substrate using a third masking process; forming first contact holes partially exposing the respective N and P source regions and second contact holes partially exposing the respective N and P drain regions, using a fourth masking process; forming N and P source electrodes connected to the N and P source regions, and N and P drain electrodes connected to the N and P drain regions, using a fifth masking process; simultaneously forming third contact holes and a common electrode using a sixth masking process; forming fourth contact holes, which expose the respective N and P drain electrodes, using a seventh masking process; and forming a pixel electrode using a eighth masking process.

12 Claims, 7 Drawing Sheets

METHOD OF MANUFACTURING LIQUID CRYSTAL DISPLAY DEVICE

CROSS-REFERENCE TO RELATED APPLICATION

This application claims priority under 35 U.S.C. 119 to Korean Patent Application No. 10-2009-0058445, filed on Jun. 29, 2009, which is hereby incorporated by reference for all purposes as if fully set forth herein.

BACKGROUND

1. Field of the Disclosure

This disclosure relates to a method of manufacturing a liquid crystal display device.

2. Description of the Related Art

Display devices have been largely highlighted in the recent information society as an important visual communication media. The display devices must meet the requirements of having low power consumption, slim size, light weight, high definition, and others, in order to highly occupy a market in future.

Actually, liquid crystal display (LCD) devices corresponding to the main devices among current flat panel display (FPD) devices satisfy not only the requirements of the display device, but also have mass-productivity and improved performance. As such, the LCD devices have been rapidly developed to provide a variety of new functions and positioned on the center of the display devices to gradually replace previous cathode ray tubes (CRTs).

In general, the LCD device supplies to liquid crystal cells arranged in a matrix shape with data signals corresponding to image information and controls the light transmittance of the liquid crystal cells, in order to display a desired image. In other words, the LCD device is mainly driven in an active matrix (AM) system. To this end, the LCD device of an AM system uses an amorphous silicon thin film transistor (a-Si TFTs) as a switch element and drives liquid crystal cells included in a pixel portion. The a-Si TFT can be formed through a low temperature process and makes it possible to use an insulation substrate with a low price. As such, the a-Si TFT has been widely used.

However, since the a-Si TFT has an electric mobility range of 1 $Cm^2/Vsec$, it is difficult to be used in peripheral circuits which operate by frequency signals of at least 1 MHz. To address this matter, integrating methods have been actively developed which simultaneously form a pixel portion and a driving circuit, which are then configured to each include polycrystalline silicon (poly-Si) thin film transistors having a larger field effect mobility than that of the a-Si TFT, on a glass substrate.

The increment of carrier mobility enhances an operating frequency of the driving circuit which determines the number of driving pixels. As such, it is easy to make the definition of a display device higher. Also, the charging time of a signal voltage in the pixel portion becomes shorter so that the distortion of a transmitting signal is reduced. Accordingly, picture-quality can be enhanced. Furthermore, the poly-Si TFT can be driven in a voltage range of below 10V unlike the a-Si TFT having a high driving voltage of about 25V, thereby reducing electric power consumption.

FIG. 1 is a planar view showing schematically the structure of an LCD device according to the related art. A driver-united LCD device including an array substrate integrated with a driving circuit is shown in FIG. 1.

As shown in the drawing, the LCD device is configured to include a color filter substrate 5, an array substrate 10, and a liquid crystal layer (not shown) between the two substrates 5 and 10. The array substrate 10 is configured to include a pixel portion 35 in which unit pixels are arranged in a matrix shape, and a driving circuit portion 30 consisting of a data driver circuit unit 31 and a gate driver circuit unit 32 positioned on outer areas of the pixel portion 35. The pixel portion 25 corresponds to an image display area.

Although they are not shown in the drawing, the pixel portion 35 of the array substrate 10 includes a plurality of gate lines, a plurality of data lines, a plurality of thin film transistors, and a plurality of pixel electrodes. The plurality of gate lines and the plurality of data lines are arranged in horizontal and vertical directions, respectively, thereby defining a plurality of pixel regions. Each of the thin film transistors is formed at an intersection of the gate and data lines and used as a switching element. The plurality of pixel electrodes are formed on the plurality of pixel regions, respectively. Also, each of the thin film transistors is used to switch a signal voltage to be applied to the pixel electrode and to control the flow of an electric current by an electric field.

The driving circuit portion 30 is positioned on the outer areas of the pixel portion 35 of the array substrate 10 which are exposed outwardly from the color filter substrate 5. The data driver circuit unit 31 is disposed on an exposed longer side area of the array substrate 10, and the gate driver circuit unit 32 is disposed on an exposed short side area of the array substrate 10.

The data driver circuit unit 31 and the gate driver circuit unit 32 uses a CMOS (complementary metal oxide semiconductor) thin film transistor corresponding to an inverter, in order to properly output an input signal. The CMOS thin film transistor is an integrated circuit of the MOS configuration which is applied to the driving circuit portion 30 requiring a high-speed signal process. The CMOS thin film transistor is configured to include a P-channel thin film transistor and an N-channel thin film transistor and has interim characteristics between those of the PMOS and NMOS thin film transistors in carrier moving speed and density.

The gate driver circuit unit 32 applies scan signals to the gate lines. The data driver circuit unit 31 applies data signals to the pixel electrodes through the data lines. To this end, the data and gate driver circuit units 31 and 32 are connected to external signal input terminals (not shown). Also, the data and gate driver circuit unit 31 and 32 control external signals from the external signal input terminals and output the controlled signals to the gate lines and the pixel electrodes.

The color filter substrate 5 is configured to include color filters (not shown) and a common electrode (not shown) which are formed on its pixel portion 35. The color filters are used to realize a variety of colors. The common electrode is formed opposite to the pixel electrodes on the array substrate 10.

The color filter substrate 5 and the array substrate 10 are separated at a fixed interval from each other by spacers (not shown) and are provided with a cell gap. The color filter substrate 5 and the array substrate 10 are combined with each other by means of a seal pattern (not shown) which is formed to surround the pixel portion 35, thereby forming a unit LCD panel. A process of combining the two substrates 5 and 10 is performed using at least one combining key formed on the color filter substrate 5 or the array substrate 10.

In this manner, the array substrate 10 of the LCD device is basically configured to include the plurality of thin film transistors. As such, a plurality of masking processes (i.e., photolithography processes) must be performed to manufacture the array substrate 10, thereby deteriorating the productivity of the LCD device. In view of this point, a method capable of reducing the number of masking processes has been required.

More specifically, the photolithography process forms a desired pattern by transcribing the pattern designed on a mask onto a substrate covered with a thin film. To this end, the photolithography process must perform a plurality of steps of photo resist coating, light exposing, developing, and others. Due to this, the production rate of the LCD devices decreases.

Furthermore, the price of the mask used to form the desired pattern is very high. As such, the manufacturing costs of the LCD device increase in proportion to the number of masks which are used in the manufacturing process.

BRIEF SUMMARY

Accordingly, the present embodiments are directed to an LCD device manufacturing method that substantially obviates one or more of problems due to the limitations and disadvantages of the related art.

An object of the present embodiment is to provide an LCD device manufacturing method that forms a common electrode and a contact hole exposing a drain electrode through one masking process so as to reduce the number of masks used in the formation of a thin film transistor.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an LCD device manufacturing method includes: preparing a substrate defined into a P-channel thin film transistor formation region and an N-channel thin film transistor formation region; forming first and second active patterns on the P-channel and N-channel thin film transistor formation regions of the substrate using a first masking process, respectively; forming a first insulation film and a first conductive film on the substrate provided with the first and second active patterns; forming a first gate electrode, which is consisted of the first conductive film, on the P-channel thin film transistor formation region of the substrate using a second masking process; forming a P drain region, a P source region, and a P channel region between the P drain and source regions on the first active pattern using the first gate electrode; forming a second gate electrode, which is consisted of the first conductive film, on the N-channel thin film transistor formation region of the substrate using a third masking process; forming an N drain region, an N source region, and an N channel region between the N drain and source regions on the second active pattern using the second gate electrode; forming a second insulation film on the substrate with the N drain, source, and channel regions; selectively removing the first and second insulation films using a fourth masking process to form first contact holes partially exposing the respective N and P source regions and second contact holes partially exposing the respective N and P drain regions; forming a second conductive film on the substrate provided with the first and second contact holes; forming N and P source electrodes, which are electrically connected to the N and P source regions through the first contact holes, and N and P drain electrodes which are electrically connected to the N and P drain regions through the second contact holes, using a fifth masking process; forming a third insulation film and a third conductive film on the substrate provided with the N and P drain electrodes; forming third contact holes, which pass through the third insulation film, and a common electrode on the third insulation using a sixth masking process; forming a fourth conductive film on the substrate provided with the third contact holes and the common electrode; forming fourth contact holes, which pass through the fourth insulation film and expose the respective N and P drain electrodes, using a seventh masking process; forming a fourth conductive film on the substrate with the fourth contact holes; and forming a pixel electrode, which is electrically connected to the N and P drain electrodes through the fourth contact holes, using a eighth masking process.

The formation of the third contact holes and the common electrode includes: forming a first photo resist pattern on the substrate provided with the third insulation film and the third conductive film through the sixth masking process; exposing the substrate with the first photo resist pattern to light to form exposed regions on the third insulation film under the third conductive film; removing portions of the third conductive film exposed by the first photo resist pattern which is used as a mask; developing the substrate with the partially removed third conductive film to form the third contact holes which pass through the third insulation film and expose the N and P drain electrodes; forming a second photo resist pattern by ashing the first photo resist pattern; and removing the exposed third conductive film using the second photo resist pattern as a mask to form the common electrode.

The sixth masking process uses a diffraction mask defined into a transmission region, a semipermeable region with slits, and a blocking region.

The blocking region is opposite to a common electrode formation region, the transmission region is opposite to a third contact hole formation region, and the semipermeable region is opposite a region between the common electrode formation region and the third contact hole formation region.

The second photo resist pattern remains only a common electrode formation region by completely removing the first photo resist pattern from a region between a third contact hole formation region and the common electrode formation region.

The LCD device manufacturing method further includes forming a buffer layer on the substrate before the formation of the first and second active patterns.

The first and second active patterns are formed by crystallizing an amorphous silicon thin film into a polycrystalline silicon thin film.

The P drain and source regions are formed by implanting p+ ions into the first active pattern using the first gate electrode as a mask, and the N drain and source regions are formed by implanting n+ ions into the second active pattern using the second gate electrode as a mask.

The first and second conductive films are formed from an opaque conductive material, the third and fourth conductive films are formed from a transparent conductive material, and the third insulation is formed from an organic insulation material.

The fourth contact hole is formed at the same position as the third contact hole and in a smaller size than that of the third contact hole.

The LCD device manufacturing method further includes forming p− lightly doped drain (LDD) regions between the P channel and drain regions and between the P channel and source regions after the formation of the P drain, source, and channel regions.

The LCD device manufacturing method further includes forming n− lightly doped drain (LDD) regions between the N channel and drain regions and between the N channel and source regions after the formation of the N drain, source, and channel regions.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
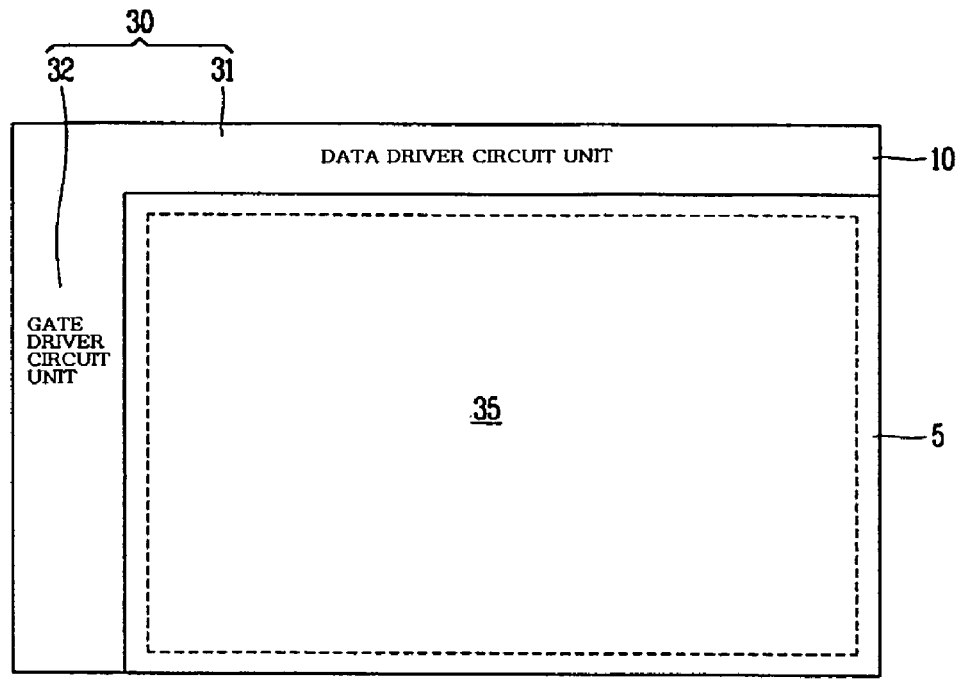
FIG. 1 is a planar view showing schematically the configuration of an LCD device according to the related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

A method of manufacturing an LCD device according to an embodiment of the present disclosure will now be explained with reference to the attached drawings.

FIGS. 2A to 2H are cross-sectional views sequentially illustrating a method of manufacturing an LCD device according to an embodiment of the present disclosure. FIGS. 3A to 3F are cross-sectional views illustrating in detail a contact hole forming process for exposing a drain electrode and a common electrode forming process shown in FIG. 2F. More specifically, FIGS. 2A to 2H and 3A to 3F are cross-sectional views sequentially illustrating a method of manufacturing an array substrate which includes the processes of forming an N-channel thin film transistor and a P-channel thin film transistor. The N-channel thin film transistor and P-channel thin film transistor can be formed on both a driving circuit portion and a pixel portion. Also, an in-plane-switching (IPS) mode LCD device will now be explained as an embodiment of the present disclosure, but the present embodiment is not limited to this.

Figure 2A:
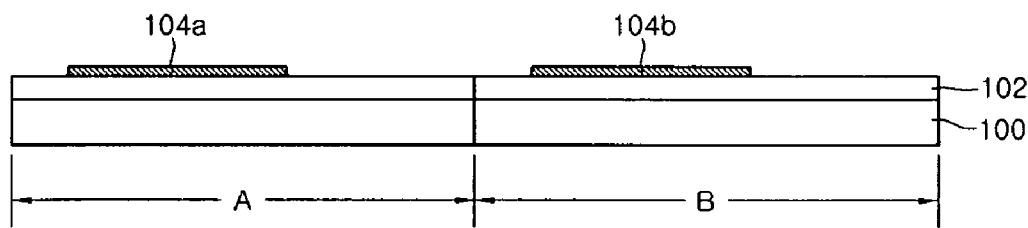
FIGS. 2A to 2H are cross-sectional views sequentially illustrating a method of manufacturing an LCD device according to an embodiment of the present disclosure.

As shown in FIG. 2A, a buffer layer 102 and a polycrystalline silicon thin film are sequentially formed on a transparent insulation substrate 100 such as a glass substrate. The polycrystalline silicon thin film is prepared by forming an amorphous silicon thin film on the buffer layer 102 and then crystallizing the amorphous silicon thin film. The substrate 100 can be distinguished into an N-channel thin film transistor formation region A and a P-channel thin film transistor formation region B. The buffer layer 102 is used to prevent impurities, such as natrium (Na; or sodium) and others, within the substrate 100 from intruding into an upper layer during later processes. The polycrystalline silicon thin film will be used as a semiconductor layer included in a thin film transistor, but the present embodiment is not limited to this. In other words, an amorphous silicon thin film can be employed as a semiconductor layer of the thin film transistor.

The amorphous silicon thin film deposited on the substrate 100 can be crystallized in the polycrystalline silicon thin film using a variety of crystallizing methods which will be described below. Also, the amorphous silicon thin film can be deposited in a variety of ways. Actually, a low pressure chemical vapor deposition (LPCVD) and a plasma enhanced chemical vapor deposition (PECVD) are typically employed to form the amorphous silicon thin film.

The crystallization of the amorphous silicon thin film typically employs a solid phase crystallization method annealing the amorphous silicon thin film within a high temperature furnace and a laser annealing method using a laser beam. Among the laser annealing methods, an eximer laser annealing method generating a laser beam of pulse shape is popularly used in the crystallization of the amorphous silicon thin film. Moreover, a sequential lateral solidification method has been recently developed which forces a grain to be grown in a horizontal direction so as to enhance crystallization characteristic.

The polycrystalline silicon thin is patterned into first and second active patterns 104a and 104b which are respectively disposed on the N-channel and P-channel thin film transistor formation regions A and B of the substrate 100. The first and second active patterns 104a and 104b are prepared by forming a first photo resist pattern (not shown) on the polycrystalline silicon thin film through a first masking process and patterning the polycrystalline silicon thin film using the first photo resist pattern.

Figure 2B:
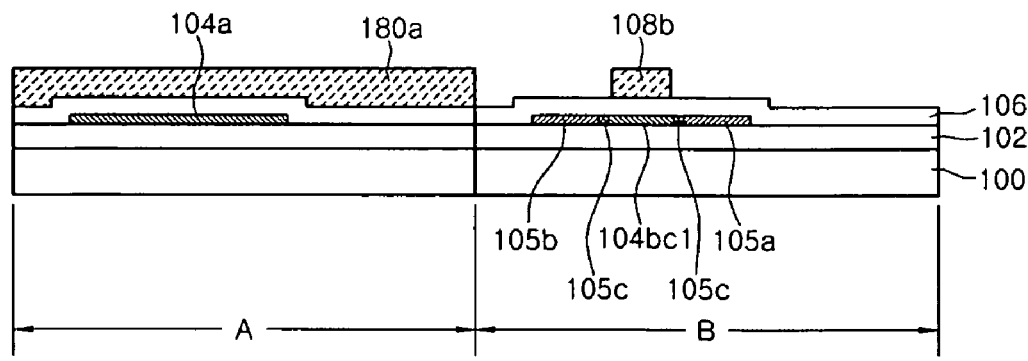

Subsequently, a first insulation film 106 and a first conductive film 108a are sequentially formed on the entire surface of the substrate 100 provided with the first and second active patterns 104a and 104b, as shown in FIG. 2B. The first conductive film 108a can be formed from a low resistivity, opaque conductive material such as aluminum (Al), an aluminum alloy, tungsten (W), copper (Cu), chromium (Cr), molybdenum (Mo), or others, in order to form a gate electrode.

A first gate electrode 108b is provided on the P-channel thin film transistor formation region B of the substrate 100 by forming a second photo resist pattern (not shown) on the first conductive film 108a through a second masking process and then patterning the first conductive film 108a using the second photo resist pattern. At this time, the first conductive film 108a on the N-channel thin film transistor formation region A remains in its original state without being patterned.

Also, p+-ions are implanted at high density in the entire surface of the substrate 100 using the first gate electrode 108b as a mask, thereby forming a P drain region 105a and a P source region 105b in fixed regions of the second active pattern 104b. As such, a P-channel region 104bc1 to be used as a transferring channel is formed between the P drain region 105a and the P source region 105b. Then, p– ions are implanted at low density in the entire surface of the substrate 100 in which the P drain region 105a and the P source region 105b are formed, again. In accordance therewith, p– lightly doped drain (LDD) regions 105c are formed between the P-channel region 104bc1 and the P drain region 105a as well as between the P-channel region 104bc1 and the P source region 105b, respectively. In this case, the first conductive film 108a remaining on the N-channel thin film transistor region A prevents the implantation of the p+ and p– ions within the N-channel thin film transistor formation region A.

Figure 2C:
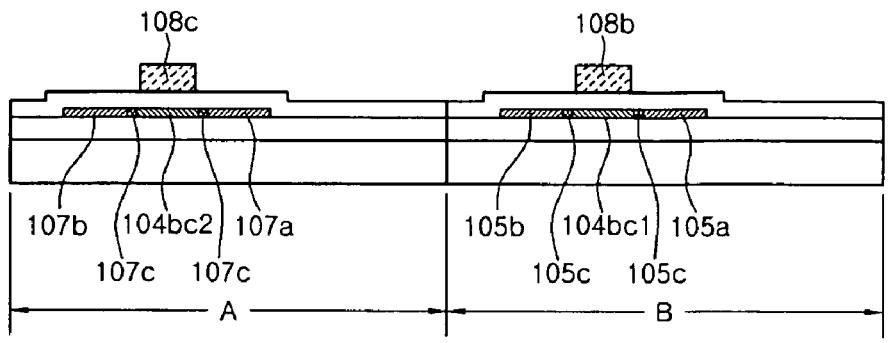

As shown in FIG. 2C, a second gate electrode 108c is provided on the N-channel thin film transistor formation region A of the substrate 100. The second gate electrode 108c is prepared by forming a third photo resist pattern (not shown) on the entire structure of the substrate 100 through a third masking process and then patterning the first conductive film 108a on the N-channel thin film transistor formation region A using the third photo resist pattern.

Also, n+ ions are implanted at high density in the entire surface of the substrate 100 using the second gate electrode 108c as a mask, thereby forming an N drain region 107a and an N source region 107b in fixed regions of the first active pattern 104a. As such, an N-channel region 104bc2 to be used as a transferring channel is formed between the N drain region 107a and the N source region 107b. Then, n– ions are implanted at low density in the entire surface of the substrate 100 in which the N drain region 107a and the N source region 107b are formed, again. In accordance therewith, n– LDD regions 107c are formed between the N-channel region 104bc2 and the N drain region 107a as well as between the N-channel region 104bc2 and the N source region 107b, respectively.

Figure 2D:
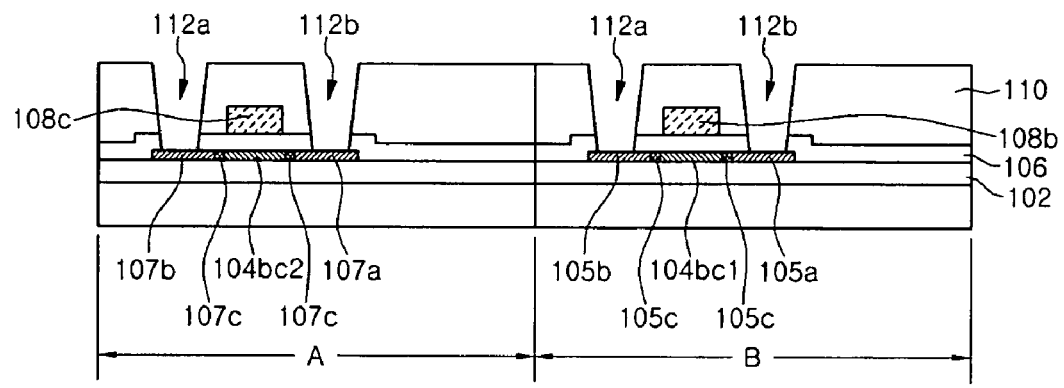

Thereafter, a second insulation film 110 is formed on the entire structure of the substrate 100, as shown in FIG. 2D. Also, first contact holes 112a and second contact holes 112b are formed by providing a fourth photo resist pattern (not shown) on the second insulation film 110 and then sequentially removing the second and first insulation films 110 and 106 exposed between the fourth photo resist pattern. The first contact holes 112a partially expose the P source region 105b and the N source region 107b, respectively. The second contact holes 112b partially expose the P drain region 105a and the N drain region 107a, respectively. The second insulation film 110 can be formed to include any one among a single layer of silicon oxide ($SiO_2$) film, a double-stacked layer of silicon nitride ($SiN_x$) and silicon oxide ($SiO_2$) films, a triple-stacked layer of $SiO_2/SiN_x/SiO_2$ films, and others.

Figure 2E:
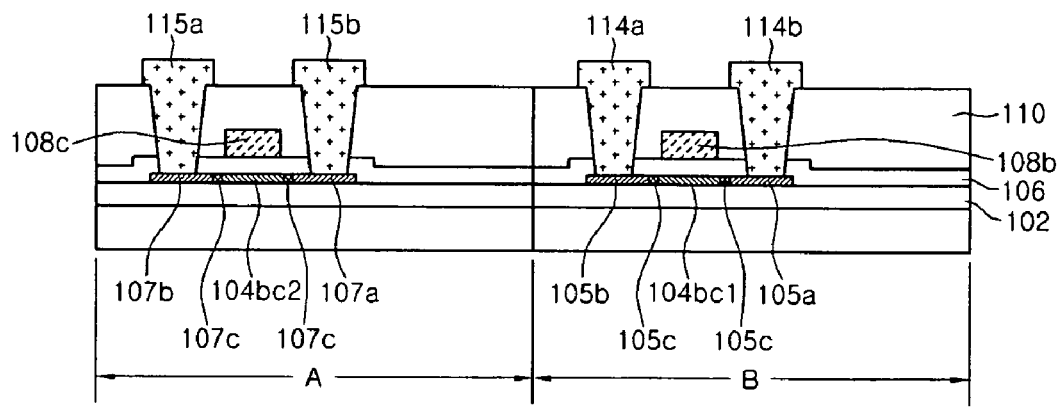

As shown in FIG. 2E, N and P source electrodes 115a and 114a each connected to the N and P source regions 107b and 105b via the first contact holes 112a are formed. Also, N and P drain electrodes 115b and 114b each connected to the N and P drain regions 107a and 105a are formed. The N source and drain electrodes 115a and 115b and the P source and drain electrodes 114a and 114b are prepared by forming a second conductive film on the substrate with the first and second contact holes 112a and 112b, providing a fifth mask pattern (not shown) on the second conductive film through a fifth masking process, and then selectively patterning the second conductive film using the fifth photo resist pattern. The second conductive film can be formed from a low resistivity, opaque conductive material such as aluminum (Al), an aluminum alloy, tungsten (W), copper (Cu), chromium (Cr), molybdenum (Mo), or others, in order to form a gate electrode.

Figure 2F:
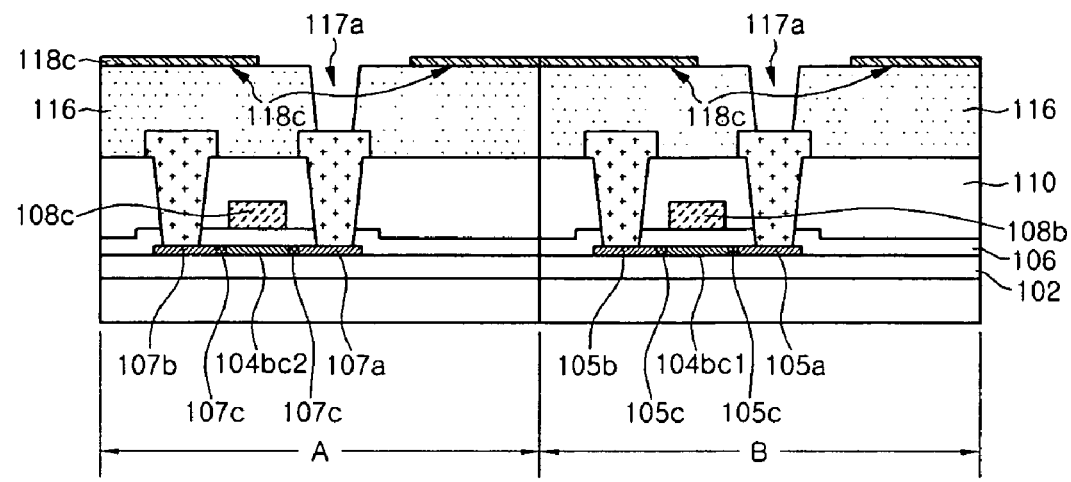
Figure 2G:
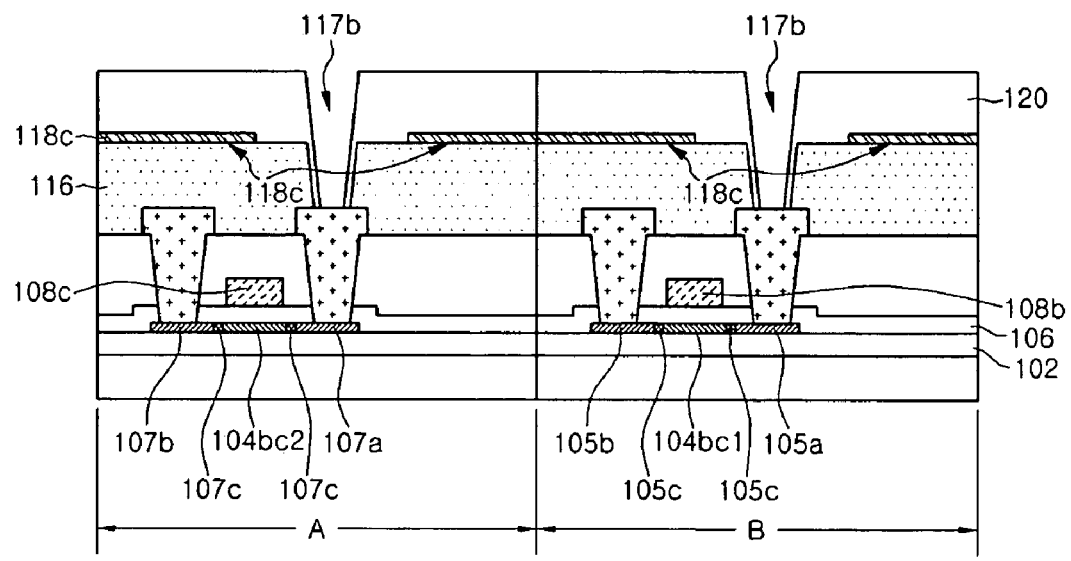

Afterward, a third insulation film 116 and a common electrode 118c thereon are formed on the substrate 100 with the N and P source electrodes 115a and 114a and the N and P drain electrodes 115b and 114b, as shown in FIG. 2F. Moreover, third contact holes 117a are formed to partially expose the N and P drain electrodes 115b and 114b. The third insulation film 116, the common electrode 118c, and the third contact holes 117a penetrating through are prepared by sequentially forming the third insulation film 116 and a third conductive film on the substrate 100 with the with the N and P source electrodes 115a and 114a and the N and P drain electrodes 115b and 114b, then providing a sixth photo resist pattern through a sixth masking process, and selectively patterning the third conductive film and the third insulation film 116 using the sixth photo resist pattern. The third insulation film 116 can be configured to contain any one of an acrylic-based organic compound and an organic insulation material such as BCB, PFCB, or others. The third conductive film used for forming the common electrode 118c can be formed from a transparent conductive material such as indium-tin-oxide and indium-zinc-oxide which have superior transmittance.

Such a method of forming the third contact holes 117a and the common electrode 118c using the sixth masking process will now be explained in detail with reference to FIGS. 3A to 3F.

First, the sixth photo resist pattern 200a is formed on the substrate 100 covered with a stacked layer of the third insulation film 116 and the third conductive film 118a through the sixth masking process. The sixth photo resist pattern 200a is prepared by coating a photo resist on the third conductive film 118a and then photographing the coated photo resist using a sixth mask (not shown).

The sixth mask includes a transmission region formed to pass light through it, semipermeable regions referred to a slit region and configured to partially pass lights through these, and blocking regions formed to intercept lights. To rectify this, the sixth mask can become a diffraction mask having three transmission indexes according to its regions. The blocking region allows the photo resist to originally remain, the semipermeable region enables the photo resist to remain thinner than the one opposite to the blocking region, and the transmission region forces the photo resist to be completely removed.

More specifically, a part of the photo resist on a region in which the common electrode 118c will be formed is opposite to the blacking region of the sixth mask and originally remains. Also, other parts of the photo resist on regions in which the third contact holes 117a will be formed are completely removed because they are opposite the transmission regions of the sixth mask. As the rest of the photo resist on regions in which the third contact holes 117a will be formed are opposite to the semipermeable regions, they remain by a smaller thickness compared to the part of the photo resist corresponding to the blocking region. As such, the sixth photo resist pattern 200a shown in FIG. 3A can be formed on the third conductive film 118a.

Subsequently, the substrate 100 partially covered with the sixth photo resist pattern 200a is exposed to light. At this time, parts of the third insulation film 116 corresponding to the regions in which the third contact holes 117a will be formed are exposed to the light passing through the third conductive film 118a, so as to form exposed regions R on the third insulation film 116.

Figure 3A:
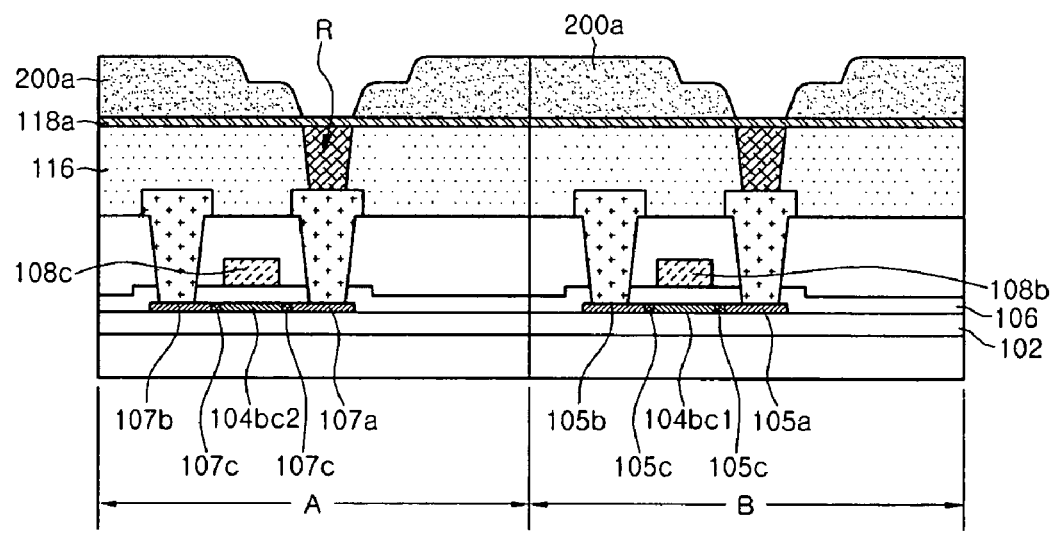
FIGS. 3A to 3F are cross-sectional views illustrating in detail a contact hole forming process for exposing a drain electrode and a common electrode forming process shown in FIG. 2F.
Figure 3B:
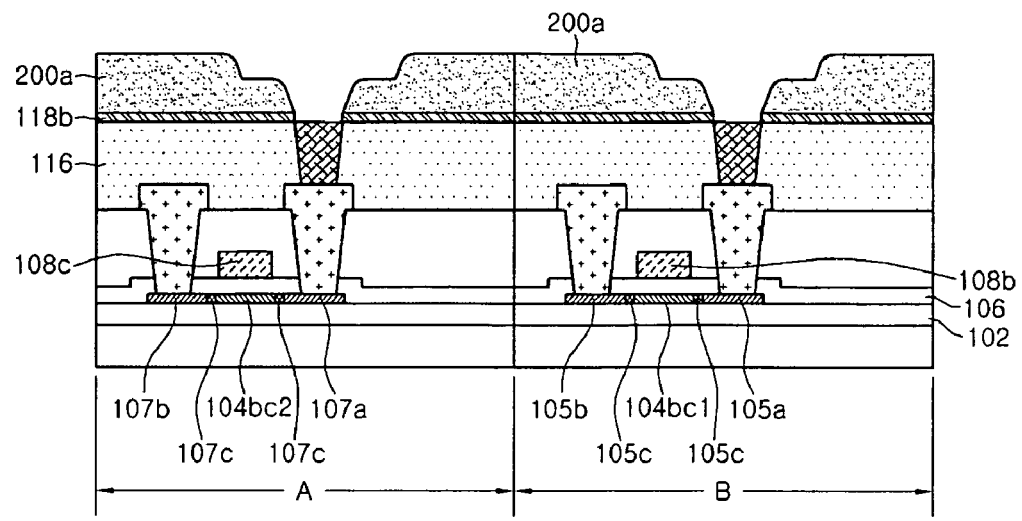

As shown in FIG. 3B, the parts of the third conductive film 118a exposed between the sixth photo resist pattern 200a which is used as a mask are removed. Accordingly, a partially removed third conductive film 118b is prepared to expose the parts of the third insulation film 116 which are positioned on the exposed regions R.

Figure 3C:
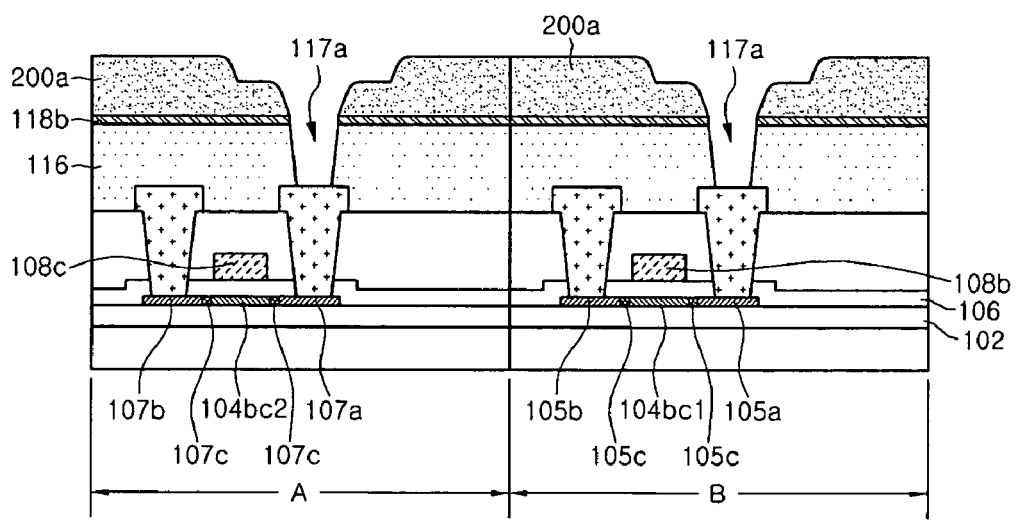

Then, the substrate 100 covered with the partially removed third conductive film 118b is developed so that the parts of the third insulation film 116 on the exposed regions R are removed. As such, the third contact holes 117a exposing the respective N and P drain electrodes 107a and 105a are formed on the third insulation film 116, as shown in FIG. 3C.

Figure 3D:
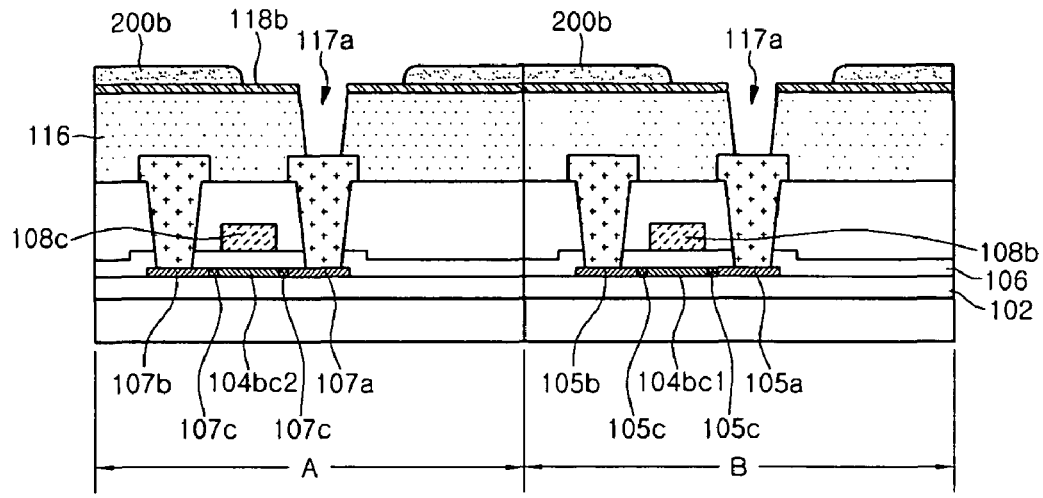

Thereafter, a seventh photo resist pattern 200b is formed by ashing the sixth photo resist pattern 200a until the partially removed third conductive film 118b is selectively exposed, as shown in FIG. 3D. The seventh photo resist pattern 200b exists only on the common electrode formation region. In other words, the photo resist is completely removed from the regions between the common electrode formation region and the third contact hole formation regions. Consequently, the partially removed third conductive film 118b is exposed between the common electrode formation region and the third contact hole formation regions.

Figure 3E:
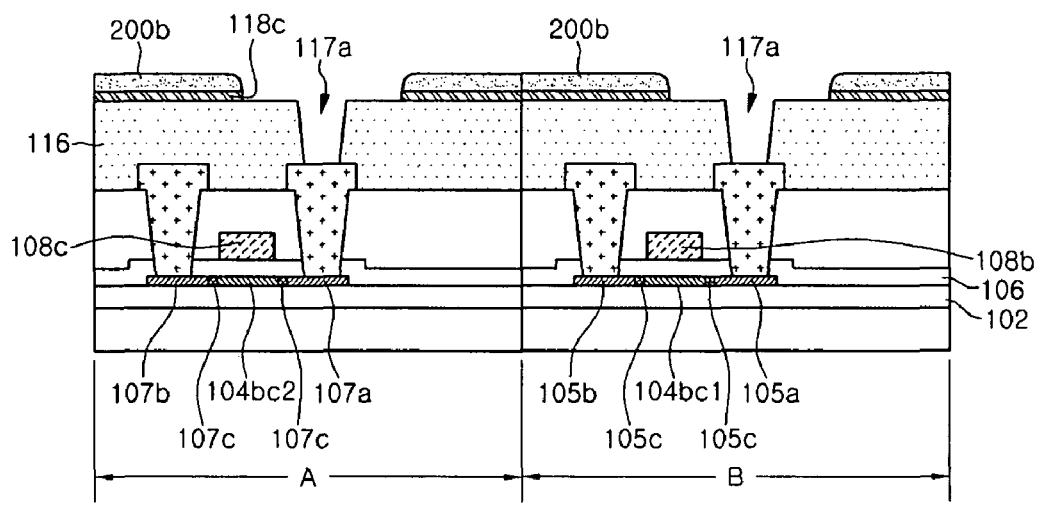
Figure 3F:
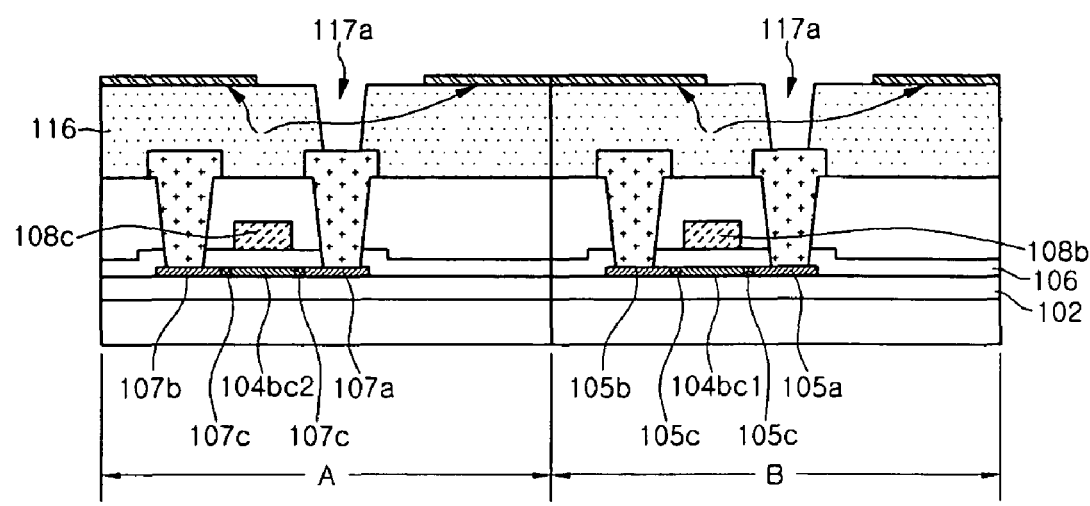

The portions of the partially removed third conductive film 118b exposed between the seventh photo resist pattern which is used as a mask are eliminated from the third insulation film 116. In accordance therewith, the common electrode 118c is formed on the third insulation film 116, as shown in FIG. 3E. Then, the seventh photo resist pattern 200b is removed through a strip process, as shown in FIG. 3F.

In this way, the third contact holes 117a and the common electrode 118c can be simultaneously formed by the sixth masking process using the mask which has three transmission indexes according to its regions.

Returning to FIG. 2G, a fourth insulation film 120 with fourth contact holes 117b is formed on the substrate 100 provided with the common electrode 118c and the third contact holes 117a. The fourth contact holes 117b pass through the fourth insulation film 120 and expose the respective N and P drain electrodes 115b and 114b. The fourth contact holes 117b are defined by forming an eighth photo resist pattern (not shown) on the fourth insulation film 120 through a seventh masking process and then selectively removing the fourth insulation film 120 using the eighth photo resist pattern.

In this case, the fourth contact holes 117b are formed at the same position as the third contact holes 117a, but the fourth contact holes 117b are formed to have a smaller size than those of the third contact holes 117a. In other words, the fourth contact holes 117b can be formed by selectively removing the portions of the fourth insulation film 120 which are filled into the third contact holes 117a. If the fourth contact holes 117b are formed at different positions or in different sizes from the third contact holes 117a, both of the third and fourth insulation films 117a and 117b must be removed. As such, it is very difficult to perform these processes.

Figure 2H:
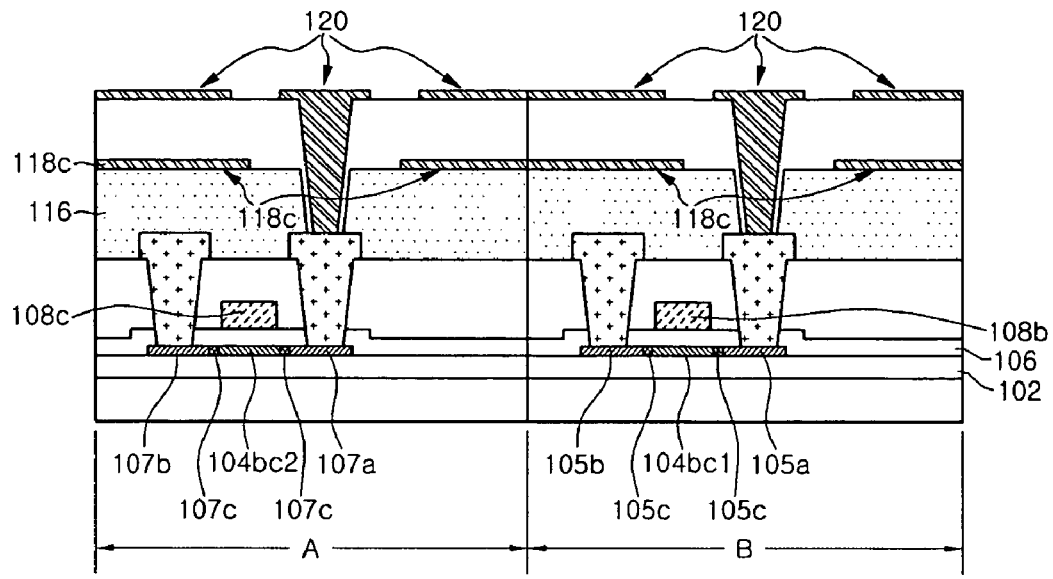

Next, a pixel electrode 130 is formed on the substrate covered with the fourth insulation film 120, as shown in FIG. 2H. The pixel electrode 130 is electrically connected to the N and P drain electrodes 115b and 114b through the fourth contact holes 117b. This pixel electrode 130 is prepared by forming a fourth conductive film on the entire surface of the substrate 100 having the fourth contact holes 117b, then providing a ninth photo resist pattern (not shown) on the fourth conductive film through an eighth masking process, and selectively patterning the fourth conductive film using the ninth photo resist pattern. The fourth conductive film used for forming the pixel electrode 130 can include a transparent conductive material such as any one of indium-tin-oxide and indium-zinc-oxide which have superior transmittance.

The array substrate of the present embodiment having the above configuration is combined opposite to a color filter substrate by means of a seal pattern (not shown) which is formed to surround an image display area (i.e., a pixel portion). The color filter substrate is configured to include color filters and a black matrix. Each of the color filters is used to realize red, green, and blue colors. The black matrix prevents the light leakage in regions occupied with the gate lines, the data lines, and the thin film transistors. The process of combining the array substrate and the color filter substrate is performed using at least one combining key formed on the color filter substrate or the array substrate.

As described above, the LCD device manufacturing method according to an embodiment of the present disclosure can simultaneously form the common electrode and the contact hole exposing the drain electrode using a single masking process. In other words, the contact hole formation process and the common electrode formation process can be performed using a single mask. Therefore, the number of masks used to manufacture the thin film transistor can be reduced.

Moreover, the LCD device manufacturing method of an embodiment of the present disclosure can be applied to other display device including thin film transistors. For example, the method of present embodiment can be used to manufacture an organic electro-luminescent display device including an organic light emission diodes which are connected to a driving transistor.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of manufacturing a liquid crystal display device comprising:
preparing a substrate defined into a P-channel thin film transistor formation region and an N-channel thin film transistor formation region;
forming first and second active patterns on the P-channel and N-channel thin film transistor formation regions of the substrate using a first masking process, respectively;
forming a first insulation film and a first conductive film on the substrate provided with the first and second active patterns;
forming a first gate electrode, which is consisted of the first conductive film, on the P-channel thin film transistor formation region of the substrate using a second masking process;
forming a P drain region, a P source region, and a P channel region between the P drain and source regions on the first active pattern using the first gate electrode;
forming a second gate electrode, which is consisted of the first conductive film, on the N-channel thin film transistor formation region of the substrate using a third masking process;
forming an N drain region, an N source region, and an N channel region between the N drain and source regions on the second active pattern using the second gate electrode;
forming a second insulation film on the substrate with the N drain, source, and channel regions;
selectively removing the first and second insulation films using a fourth masking process to form first contact holes partially exposing the respective N and P source regions and second contact holes partially exposing the respective N and P drain regions;

forming a second conductive film on the substrate provided with the first and second contact holes;

forming N and P source electrodes, which are electrically connected to the N and P source regions through the first contact holes, and N and P drain electrodes which are electrically connected to the N and P drain regions through the second contact holes, using a fifth masking process;

forming a third insulation film and a third conductive film on the substrate provided with the N and P drain electrodes;

forming third contact holes, which pass through the third insulation film, and a common electrode on the third insulation using a sixth masking process;

forming a fourth insulation film on the substrate provided with the third contact holes and the common electrode;

forming fourth contact holes, which pass through the fourth insulation film and expose the respective N and P drain electrodes, using a seventh masking process;

forming a fourth conductive film on the substrate with the fourth contact holes; and forming a pixel electrode, which is electrically connected to the N and P drain electrodes through the fourth contact holes, using a eighth masking process.

2. The method claimed as claim 1, wherein the formation of the third contact holes and the common electrode includes:

forming a first photo resist pattern on the substrate provided with the third insulation film and the third conductive film through the sixth masking process;

exposing the substrate with the first photo resist pattern to light to form exposed regions on the third insulation film under the third conductive film;

removing portions of the third conductive film exposed by the first photo resist pattern which is used as a mask;

developing the substrate with the partially removed third conductive film to form the third contact holes which pass through the third insulation film and expose the N and P drain electrodes;

forming a second photo resist pattern by ashing the first photo resist pattern; and removing the exposed third conductive film using the second photo resist pattern as a mask to form the common electrode.

3. The method claimed as claim 2, wherein the sixth masking process uses a diffraction mask defined into a transmission region, a semipermeable region with slits, and a blocking region.

4. The method claimed as claim 3, wherein the blocking region is opposite to a common electrode formation region, the transmission region is opposite to a third contact hole formation region, and the semipermeable region is opposite a region between the common electrode formation region and the third contact hole formation region.

5. The method claimed as claim 2, wherein the second photo resist pattern remains only a common electrode formation region by completely removing the first photo resist pattern from a region between a third contact hole formation region and the common electrode formation region.

6. The method claimed as claim 1, further comprises forming a buffer layer on the substrate before the formation of the first and second active patterns.

7. The method claimed as claim 1, wherein the first and second active patterns are formed by crystallizing an amorphous silicon thin film into a polycrystalline silicon thin film.

8. The method claimed as claim 1, wherein the P drain and source regions are formed by implanting p+ ions into the first active pattern using the first gate electrode as a mask, and the N drain and source regions are formed by implanting n+ ions into the second active pattern using the second gate electrode as a mask.

9. The method claimed as claim 1, wherein the first and second conductive films are formed from an opaque conductive material, the third and fourth conductive films are formed from a transparent conductive material, and the third insulation is formed from an organic insulation material.

10. The method claimed as claim 1, wherein the fourth contact hole is formed at the same position as the third contact hole and in a smaller size than that of the third contact hole.

11. The method claimed as claim 1, further comprises forming p− lightly doped drain (LDD) regions between the P channel and drain regions and between the P channel and source regions after the formation of the P drain, source, and channel regions.

12. The method claimed as claim 1, further comprises forming n− lightly doped drain (LDD) regions between the N channel and drain regions and between the N channel and source regions after the formation of the N drain, source, and channel regions.

* * * * *